TRANSISTOR GATES

Filed Dec. 31, 1956

INVENTOR:
Leon Steinman

By Seymour Scholnick
Attorney

United States Patent Office 2,901,640

Patented Aug. 25, 1959

2,901,640

TRANSISTOR GATES

Leon Steinman, Los Angeles, Calif., assignor, by mesne assignments, to Litton Industries, Inc., Beverly Hills, Calif., a corporation of Delaware Application December 31, 1956, Serial No. 631,563

12 Claims. (Cl. 307—88.5)

The present invention relates to transistor gates for use in electronic computing and/or switching circuits and more particularly to a triple input single transistor gate for combining three bilevel input signals in accordance with a predetermined Boolean relationship to form a resultant bilevel output signal.

In recent years, considerable attention has been directed to the use of transistors in electronic gating circuits. A number of articles have been published disclosing how transistors may be utilized to mechanize multiple input gates and how such transistor mechanized gates may be combined to form more complicated gating networks. For example, in the article "Directly Coupled Transistor Circuits" by Beter, Bradley, Brown and Rubinoff, appearing in the June 1955 issue of Electronics, the construction of "and" and "or" gates is shown and also the combination of such gates to form binary adder networks and other more complicated networks is illustrated.

As is familiar to those skilled in the art, an "and" gate is a circuit which functions to combine a plurality of applied bilevel (high or low) input signals in accordance with the Boolean "and" relationship to form a predetermined output signal only if all of the input signals are at a predetermined level. An "or" gate functions to combine bilevel input signals in accordance with the Boolean "or" relationship to form a predetermined output signal whenever any of the input signals is at a predetermined level.

As shown in the aforementioned article and in other publications, a multiple input transistor mechanized "and" gate may be constructed by connecting a plurality of transistors in series, the collector of each transistor being connected to the emitter of the next, the emitter of the first transistor being connected to a source of relatively high voltage and the collctor of the last transistor being connected through a resistor to a source of relatively low voltage. Each bilevel input signal to the "and" gate is applied to the base of a corresponding one of the series arranged transistors and the gate output signal is derived from the junction of the resistor and the collector of the last transistor.

In the operation of this prior art transistor gate each transistor is rendered conductive only if the corresponding bilevel input signal is at a low level. A low impedance connection from the resistor to the source of relatively high voltage can be established only when all transistors are conductive and therefore only when all of the bilevel input signals are at their low levels. At such a time, the (normally low) voltage level of the output signal is raised high because of the series conductive path formed to the source of relatively high voltage. Thus in overall operation of the "and" gate a predetermined high level output signal is produced only when all input signals are low. "Or" functions are similarly mechanized in accordance with this prior art scheme by placing transistors in parallel connection rather than in series arrangement. More complicated gating networks are established by combining "and" and "or" gates of the described type.

It is seen that in these prior art transistor gates, one transistor is required for each bilevel input signal. In this respect the recently developed transistor gates are very similar to the well-known and widely utilized diode rectifier mechanized gates which also utilize one diode rectifier for each bilevel input signal and also requires some additional diodes for the combining of simple gates to form more complex gating networks. The principal advantage of these recently developed transistor gates over the conventional diode rectifier gates is that the transistor gates, because of the intrinsic current amplification in each transistor, draw relatively little current from the sources of bilevel input signals, thus allowing a single source of limited current capability (a flip-flop for example) to supply its bilevel signal to a large number of gate inputs.

On the other hand, transistors are considerably more expensive and to some extent are believed less reliable than diode rectifiers, and therefore use of large numbers of gating transistors is undesirable. However because of the fact that, in these recently developed transistor gates, one transistor is required for each bilevel input signal, the mechanization of relatively simple Boolean expressions requires quite a large number of transistors. For example, consider the mechanization of the following simple and rather commonly occurring Boolean expression;

$$O=e\bar{b}+cb \qquad \text{I}$$

where $e$, $b$ and $c$ are applied bilevel input signals and O is a resultant output signal, the plus symbol (+) indicating that the Boolean "or" operation is to be performed upon the conjoined signals and the absence of a (+) indicating that the Boolean "and" operation is to be performed upon the conjoined signals.

Expression I indicates that the output signal O is to be formed only when signal $e$ is at a predetermined level and signal $b$ is at one of its levels or signal $c$ is at the predetermined level and signal $b$ is at the other of its levels. In the transistor mechanization of expression I in the manner known to the prior art the complement $\bar{b}$ of signal $b$ would be required as an additional input signal and four transistors would be required, one for each input signal. If expression I were to be mechanized in conventional manner with diode rectifiers, six diode rectifiers would be required.

As another example, consider the mechanization, as explained in the aforesaid article, of the Boolean expression for the half-adder binary sum (represented by a signal designated $S_h$) of two binary digits (represented respectively by a first signal $d_1$ and a second signal $d_2$). This Boolean half-adder expression is as follows:

$$S_h=d_1\bar{d}_2+\bar{d}_1d_2 \qquad \text{II}$$

Expression II is sometimes said to state the "exclusive or" function for it indicates that the output signal $S_h$ is to be formed only if signal $d_1$ exclusively is at a predetermined level or signal $d_2$ exclusively is at the predetermined level but not both. As described in the aforesaid article, the mechanization of expression II would require that the complementary signals $\bar{d}_1$ and $\bar{d}_2$ be available as additional input signals and would utilize four transistors, one for each of the input signals. In the conventional mechanization of expression II with diode rectifiers, six diode rectifiers would be required.

In distinct contrast to the prior art transistor mechanized gates, in accordance with the present invention there is provided a triple input electronic gate utilizing only a single transistor, which functions to combine three applied bilevel input signals in accordance with a predetermined Boolean relationship to produce a resultant bilevel output signal.

If the three input signals are designated $e$, $b$ and $c$, respectively and the output signal is designated as signal O, it can be demonstrated as shown hereinbelow that the single transistor gate of the present invention operates to combine these three input signals in accordance with the expression I to produce a predetermined output signal O only when signal $e$ is at a predetermined level and signal $b$ is at one of its levels or when signal $c$ is at the predetermined level and signal $b$ is at the other of its levels. In such operation of the single transistor gate of the present invention, signal $e$ is applied to the emitter of the transistor, signal $b$ is applied to the base, signal $c$ is applied to the collector of the transistor. The required output signal O may then be derived from either the collector or the emitter.

It should be noted that in such operation, generation of the complementary signal $\bar{b}$ is not required. Note further that, in such operation, the single transistor gate of the present invention alone performs an operation which required four transistors (or six diode rectifiers) in the prior art mechanizations. Great economy in cost and number of components and considerable increases in reliability is thus obtained through use of the triple input single transistor gate of the invention.

In further application, as described hereinbelow, of the triple input single transistor gate of the invention, if a bilevel input signal $d_1$ is applied to the base of the transistor and complementary signal $d_2$ and $\bar{d}_2$ are applied to the collector and emitter, an output signal $O=S_h$ can be generated in accordance with the half-adder ("exclusive or") function of expression II. Thus half addition of two binary digits can be performed with a single transistor rather than as in the prior art with four transistors or six diode rectifiers.

By interchanging the leads which apply the complementary signal $d_2$ and $\bar{d}_2$, the function which is complementary to the "exclusive or" function may be mechanized, so that the output signal O will then be produced by the single transistor gate whenever the input signals $d_1$ and $d_2$ are both at a predetermined level but not if they are at different levels. A full binary adder may be constructed in accordance with the invention with only two transistors by interconnecting two of the single transistor gates of the invention. A large number of other simple Boolean functions can be mechanized by suitable selection of the input signals which are applied to the triple input single transistor gate of the invention. Gating networks of any order of complexity may be constructed by interconnecting single transistor gates of the type described.

It is therefore an object of the invention to provide a triple input single transistor gate for combining three bilevel input signals in accordance with a predetermined Boolean expression to form a residual bilevel output signal.

It is another object of the invention to provide a triple input single transistor gate for combining three bilevel input signals $e$, $b$ and $c$ to form an output signal O which is at a high level only when signal $e$ is high and signal $b$ is at a predetermined one of its levels or when signal $c$ is high and signal $b$ is at the other of its levels.

It is yet another object of the invention to provide a single transistor "exclusive or" gate.

It is still another object of the invention to provide a single transistor binary half-adder and a two transistor full-adder.

It is yet another object of the invention to provide a single transistor triple input gate in which three bilevel input signals are applied respectively to the base, emitter and collector electrodes of the transistor, a resultant bilevel output signal being formed at a predetermined one of the collector and emitter electrodes.

It is a further object of the invention to provide a single transistor gate of the type described wherein the transistor is normally non-conductive and is rendered conductive whenever the base applied signal has a predetermined polarity with respect to an emitter or collector applied signal, the level of the output signal corresponding to the level of a predetermined one of the emitter and collector applied signals if the transistor is conductive and corresponding to the level of the other of said emitter and collector applied signals if the transistor is non-conductive.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

Figure 1:
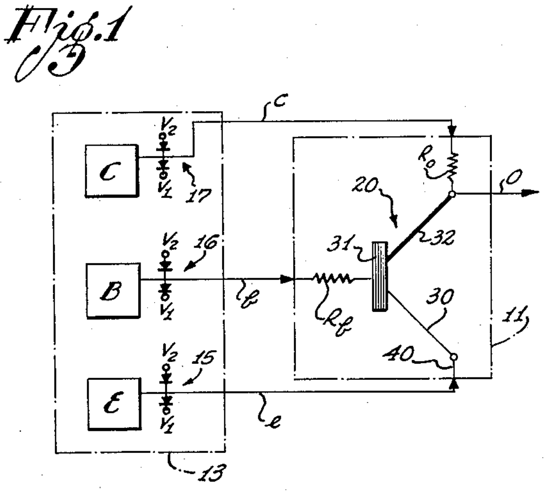
Fig. 1 is a circuit diagram of a preferred embodiment of a triple input single transistor gate in accordance with the present invention.

Referring now to the drawing wherein like parts are similarly designated throughout the several views, there is shown in Fig. 1, a preferred embodiment 11 of the triple input single transistor gate of the present invention which as indicated in Fig. 1 is adapted for receivng three bilevel input signals designated as $e$, $b$ and $c$ and for combining these bilevel input signals to produce a resultant bilevel output signal O in accordance with a predetermined Boolean logical function. More particularly the triple input single transistor gate 11 of the present invention functions to combine bilevel input signals $e$, $b$ and $c$ in such a manner that the resultant output signal O has a high level only when signal $e$ is high and signal $b$ is at a predetermined one of its levels or when signal $c$ is high and signal $b$ is at the other of its levels.

For purposes of example, the bilevel signals $e$, $b$ and $c$ are shown in Fig. 1 as being supplied by a signal source 13 which as shown in Fig. 1 comprises three conventional flip-flop circuits E, B and C producing corresponding bilevel output signals $e$, $b$ and $c$, respectively. However, those skilled in the art will of course understand that the bilevel signals $e$, $b$ and $c$ may be supplied by a number of other different types of conventional sources of bilevel signals as for example, preceding logical gating networks, clock pulse (timing pulse) generators, magnetic core circuits, etc.

As shown in Fig. 1, within source 13 the bilevel signale $e$, $b$ and $c$ are stabilized or clamped by corresponding clamping circuits generally designated 15, 16 and 17 so that the bilevel signals at their high and low levels are maintained at predetermined high and low voltages $V_1$ and $V_2$ respectively, supplied by voltage sources not shown. Such clamping or voltage stabilization circuits are often included within flip-flops and other conventional sources of bilevel signals, the voltage stabilization circuits being separately shown in Fig. 1 for purposes of greater clarity of illustration.

Referring again to triple input transistor gate 11, it is seen, as shown in Fig. 1, that gate 11 comprises a single transistor generally designated 20, having emitter, base and collector electrodes designated 30, 31, and 32, respectively; and also apparatus for applying bilevel signals $e$, $b$ and $c$ to said emitter, base and collector electrodes 30, 31 and 32, respectively. As illustrated in Fig. 1, bilevel signal $e$ is applied over a conductor 40 to emitter electrode 30, while bilevel signals $b$ and $c$ are applied to base and collector electrodes 31 and 32. The resultant bilevel output signal O is generated by transistor 20 at collector electrode 32 as shown in Fig. 1.

In operation bilevel output signal O will have either a high or low voltage level, these voltage levels of output signal O being substantially the same as the high and low voltage levels (voltage levels $V_1$ and $V_2$) of the input signals, $e$, $b$ and $c$, the level of output signal O being related to the levels of the input signals $e$, $b$ and $c$ in accordance with the relationship hereinbefore described; namely, that output signal O will have a high level only when signal $e$ is high and signal $b$ is at a predetermined one of its levels or when signal $c$ is high and signal $b$ is at the other of its levels.

The manner in which output signal O is produced and the precise nature of the above-described relationship between the levels of output signal O and the levels of input signals $e$, $b$ and $c$ may be greatly clarified by considering the operation of gate 11 for each possible different combination of levels of the bilevel input signals $e$, $b$ and $c$, as illustrated in the following table, Table I.

*Table I*

| Row | Level of input signals | | | Level of Output Signal O—assuming transistor 20 is— | |
|---|---|---|---|---|---|
| | $e$ | $b$ | $c$ | PNP | NPN |
| 1 | 0 | 0 | 0 | 0 | 0 |
| 2 | 0 | 0 | 1 | 0 | 1 |
| 3 | 0 | 1 | 0 | 0 | 0 |
| 4 | 0 | 1 | 1 | 1 | 0 |
| 5 | 1 | 0 | 0 | 1 | 0 |
| 6 | 1 | 0 | 1 | 1 | 1 |
| 7 | 1 | 1 | 0 | 0 | 1 |
| 8 | 1 | 1 | 1 | 1 | 1 |

In Table I, the possible combinations of the voltage levels of input signals $e$, $b$ and $c$ are listed in rows 1 through 8, respectively, the digit 1 signifying a high level of an input signal and the digit 0 signifying a low level of an input signal. In each row, there is shown the corresponding resultant level of output signal O, assuming first that transistor 20 shown in Fig. 1 is a PNP transistor and secondly, that transistor 20 is a NPN transistor.

Considering now the operation of the embodiment of gate 11 shown in Fig. 1 for the situation in which transistor 20 is a PNP transistor: assume first that, as indicated in row 1 of Table I, the input signals $e$, $b$ and $c$ are all at their low levels. Since there is no source of a higher voltage level, it is clear that output signal O must also be at a low level, as indiacted in Table I.

Similarly, as indicated in row 8 of Table I, when the input signals $e$, $b$ and $c$ are all at their high levels, since there is no source of a low voltage level, output signal O must also be at a high level.

As shown in row 2 of Table I, when the input signals $e$ and $b$ are at their low levels and signal $c$ is at a high level, output signal O will be at a low level, for the following reasons: Since signal $c$ is high and signal $b$ is low the P–N collector-base junction will be forward biased, causing this junction to become highly conductive so that collector 32 will have very nearly the same voltage as base 31. A current $I_c$ will flow across this junction from collector 32 into base 31, and because of inherent transistor action a very nearly equal current $I_e$ will flow from base 31 to emitter 30. Since the oppositely directed currents $I_e$ and $I_c$ are very nearly equal, the resultant base current $I_b=I_c-I_e$ is very nearly zero, so that there is little or no voltage drop across base resistor $R_b$, thus establishing the voltage level at base 31

(and hence the level of signal O at collector 32) as being equal to the low level of signal $b$. Thus it is seen that output signal O will be at its low level, as was hereinbefore indicated.

As shown in row 3, when signals $e$ and $c$ are low and signal $b$ is high, output signal O will be low. In this situation both the P–N emitter-base junction and the P–N collector-base junction are back-biased so that they are non-conductive. Thus no current will flow through transistor 20 and accordingly the voltage level of signal O at collector 32 corresponds to the low level of signal $c$.

Referring next to row 4, when signal $e$ is low and signals $b$ and $c$ are high, output signal O is high. In this instance the emitter-base junction is back-biased non-conductive and there is no effective bias across the collector-base junction so that it too is subtsantially non-conductive. Thus current is not drawn through collector 32 and therefore the level of output signal O at collector 32 corresponds to the high level of signal $c$.

Referring now to row 5, when signal $e$ is high and signals $b$ and $c$ are both low, output signal O will be high. In this case, the emitter-base junction is forward-biased conductive so that the voltage level at base 31 corresponds to the high level of signal $e$. Because of inherent transistor action current will flow across the back-biased collector-base junction thus causing the voltage level of signal O to rise to the high level prevailing at base 31 (corresponding to the high level of signal $e$).

Referring now to row 6, when signals $e$ and $c$ are high and signal $b$ is low, output signal O will be high. In this case, both the emitter-base and collector-base junctions are forward-biased conductive. Thus the voltage level at base 31 will correspond to the high level of signal $e$ and therefore because of the high conductivity of the collector-base junction the voltage level of signal O at collector 32 must be very equal to the level of the base voltage, and will accordingly be at a high level.

Referring now to row 7, when signals $e$ and $b$ are both high and signal $c$ is low, output signal O at collector 32 with be low. In this case the collector-base junction is back-biased non-conductive and there is no effective bias across the emitter-base junction. Thus no current flows through transistor 20 and therefore output signal O at collector 32 will have a low level corresponding to the low level of signal $c$.

The operation of gate 11, assuming transistor 20 is a PNP transistor, has now been fully described for all possible combinations of levels of bi-level input signals $e$, $b$ and $c$ as shown in rows 1 through 8 of Table I. It is clear from inspection of Table I that, when transistor 20 is a PNP transistor, output signal O at collector 32 will have a high level whenever signal $e$ is high and signal $b$ is at its low level or when signal $c$ is high and signal $b$ is at its other high level. Restating this result mathematically in the form of a Boolean logical equation, there is obtained the following Boolean equation:

$$O=e\bar{b}+cb \qquad (1)$$

where it is understood that output signal O is formed at the collector of a PNP transistor and where the plus symbol (+) indicates that the logical "or" operation is to be performed upon the expressions joined thereby and the absence of a + indicates that the logical "and" operation is to be performed.

It is interesting to note the great equipment reductions obtained by mechanizing Eq. 1 with the unique triple input single transistor gate of the present invention, rather than with conventional diode "and" and "or" gates of the prior art. In the prior art, in the mechanization of Eq. 1, it would not be possible to form output signal O from signals $e$, $b$ and $c$ alone. It would be necessary to first form an additional signal $\bar{b}$ complementary to signal $b$, this being done by passing signal $b$ through an inverting amplifier to form the complementary signal $\bar{b}$. Then, in the prior art, signals $e$ and $\bar{b}$ would be combined in a conventional diode "and" gates (comprising two diodes and a resistor) to form a signal $e\bar{b}$; signals $c$ and $b$ would be combined in another "and" gate to form signal $cb$; and the signals $e\bar{b}$ and $cb$ would be combined in a conventional diode "or" gate (also comprising two diodes and a resistor) to form output signal $O=e\bar{b}+cb$. Thus, in the prior art, one inverting amplifier and three diode gates comprising six diodes and three resistors would be required to mechanize Eq. 1. On the other hand, it will be noted that with gate 11 of the present invention, Eq. 1 may be mechanized with a single transistor and a few resistors.

Considering now the operation of the embodiment of gate 11 shown in Fig. 1, for the situation in which transistor 20 is an NPN transistor, are shown in the last column of Table I for the eight possible combinations of input signals $e$, $b$ and $c$. The results shown in Table I, as to the levels of output signal O (when transistor 20 is an NPN transistor) may of course be separately verified for each of the eight individual instances of Table I by the same type of detailed consideration of operation that has been utilized hereinbefore.

A somewhat briefer way of justifying these results is to realize, as a summarization of the overall operation of gate 11 shown in Fig. 1, that on the one hand if the emitter-junction or the collector-base junction (or both) are forward-biased, transistor 20 becomes strongly conductive so that the voltage level of signal O at collector 32 corresponds to the voltage level of signal $e$ at emitter 30 while on the other hand if neither junction is forward-biased, transistor 20 is then non-conductive so that the voltage level of signal O at collector 32 must correspond to the level of signal $c$. In applying this summarization, to justify the results shown in the last column of Table I, it will be noted that when transistor 20 is an NPN transistor, one or both of its junctions will be forward-biased for those combinations of input signals shown in rows 3, 4 and 7 of Table I and therefore in these rows the level of output signal O, as shown in the last column of Table I, is the same as the level of signal $e$. In all other rows (rows 1, 2, 5, 6 and 8), the combination of input signals is such that neither junction is forward-biased and in these rows therefore, the level of output signal O is the same as the level of signal $c$.

It can be seen from inspection of the last column of Table I that (for transistor 20 being an NPN transistor) output signal O has a high level whenever signal $e$ is high and signal $b$ is also high or when signal $c$ is high and signal $b$ is low. Restating this in mathematical form there is obtained the following Boolean logical Eq. 2 defining output signal O:

$$O=eb+c\bar{b} \qquad (2)$$

where it is understood that output signal O is formed at the collector (as shown in Fig. 1) of an NPN transistor.

Figure 2:
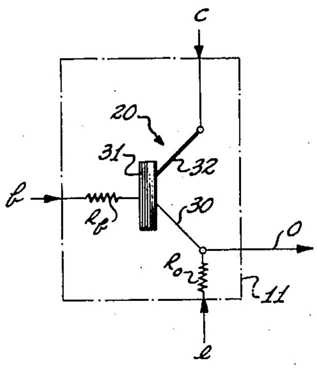
Fig. 2 is a circuit diagram of an alternative embodiment of the triple input single transistor gate of the present invention.

Referring now to Fig. 2, there is shown another embodiment of the triple input transistor gate 11 of the present invention in which the output resistor $R_0$ has been placed in series with emitter electrode 30 rather than with collector electrode 32. Thus as shown in Fig. 2, signal $c$ is applied directly to collector electrode 32 while signal $e$ is applied through resistor $R_0$ to emitter electrode 30, signal $b$ being applied as before to base 31 and the output signal O being formed at emitter electrode 30 rather than at collector electrode 32. Since transistors generally have somewhat symmetrical characteristics, it is clear that the roles of emitter and collector will be interchanged in the embodiment of gate 11 shown in Fig. 2 as compared to the embodiment of gate 11 shown in Fig. 1 so that the effects of signals $e$ and $c$ are reversed. In all other respects, operation of the two embodiments will be substantially the same.

It is therefore apparent that for the embodiment of gate 11 shown in Fig. 2 the logical equations defining output signal O for the cases of a PNP and NPN transistor respectively, may be found by interchanging signals $e$ and $c$ wherever they appear in Eqs. 1 and 2, respectively. In this way corresponding Eqs. 1*a* and 2*a* respectively, are obtained:

$$O=c\bar{b}+eb \qquad (1a)$$

(where output signal O is formed at the emitter of a PNP transistor) and $$O=cb+e\bar{b} \qquad (2a)$$

(where output signal O is formed at the emitter of an NPN transistor).

It is interesting to note that Eq. 1*a* is identical to Eq. 2 while Eq. 2*a* is identical to Eq. 1. From Eq. 1*a*, it is seen that output signal O, thus indicating that the corresponding embodiments of the invention may be directly substituted for one another in all applications when formed at the emitter (as indicated in Fig. 2) of a PNP transistor will have a high level if $c$ is high and $b$ is low or if $e$ is high and $b$ is high. From Eq. 2*a* it is seen that output signal O, when formed at the emitter of an NPN transistor will have a high level if $c$ is high and $b$ is high or if $e$ is high and $b$ is low.

In considering the circuits shown in succeeding figures it will be assumed, for the purposes of obtaining greater clarity of description, that the embodiment of gate 11 shown in Fig. 1 is utilized in each instance and that a PNP transistor is utilized therein so that Eq. 1 applies. Those skilled in the art will readily perceive in view of the foregoing explanation, how similar circuits may be formed using NPN transistors and/or the embodiment of gate 11 shown in Fig. 2.

Figure 3:
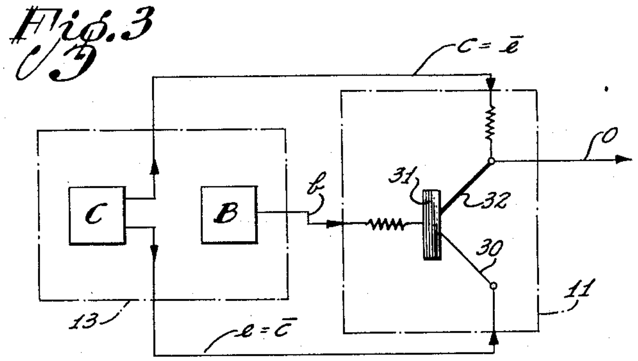
Fig. 3 is a circuit diagram illustrating the mechanization of the "exclusive or" function and its complementary function with a triple input single transistor gate in accordance with the present invention.

Referring now to Fig. 3, there is shown an embodiment of gate 11 which functions to produce output signal O at its high level only when two applied input signals $b$ and $c$ are at the same level, that is both high or both low. As shown in Fig. 3, to accomplish this result signals $b$ and $c$ supplied by a source 13, are applied to base 31 and collector electrode 32 respectively, and a signal $\bar{c}$ which is complementary to signal $c$ is also supplied by source 13 and applied as signal $e$ to emitter electrode 32.

By making the substitution $e=\bar{c}$ in Eq. 1, there is obtained the following Eq. 3 defining the levels of output signal O for the embodiment of the invention shown in Fig. 3:

$$O=\bar{c}\bar{b}+cb \qquad (3)$$

Thus it is seen from Eq. 3 that, as hereinbefore indicated, output signal O will have a high level only when signals $b$ and $c$ are both low ($\bar{b}\bar{c}$) or both high ($bc$).

For purposes of example, as shown in Fig. 3, signal $b$ is illustrated as being produced within source 13 by a flip-flop B, while signals $c$ and $\bar{c}$ are illustrated as being the complementary output signals produced by a flip-flop C. However, as described hereinbefore, source 13 may comprise any type of circuit for forming the bilevel input signals.

Those skilled in the art will readily perceive in connection with Fig. 3, that since signal $e=\bar{c}$, it must also be true that signal $c=\bar{e}$. By making the substitution $c=\bar{e}$ in Eq. 1 there is obtained the following Eq. 3*a* which is equivalent to Eq. 3 and which makes the equivalent statement that output signal O will be high only when signals $e$ and $b$ are at different levels:

$$O=e\bar{b}+\bar{e}b \qquad (3a)$$

Eq. 3*a* it will be recognized thus defines signal O as being the result produced by performing the so-called "exclusive or" operation upon signals $e$ and $b$—that is, O will be high if $e$ exclusively is high or $b$ exclusively high. Restating Eq. 3*a* in terms of the "exclusive or" operation there is obtained the following equation:

$$O=e\oplus b$$

where the symbol $\oplus$ indicates that the "exclusive or" operation is performed upon the signals conjoined thereby.

The performance of the "exclusive or" operation is often required in digital computing and switching circuits and normally requires for its mechanization six diodes and three resistors plus an inverting amplifier in contrast to the single transistor and a few resistors required by gate 11 of the present invention. Thus it is clear that the amount of equipment required to mechanize the "exclusive or" ($\oplus$) operation is greatly reduced through use of triple input transistor gate 11 of the present invention.

As one example of the important applications of the "exclusive or" operation in digital computation, consider the operation of an ordinary binary adder which functions to combine bivalued signals representing three binary (1 or 0-valued) digits to form an output signal representing the binary sum of the digits. For purposes of clarity assume that the three 1 or 0-valued binary digits are represented by corresponding high or low level input signals designated as input signals $d_1$, $d_2$ and $d_3$ respectively, the output signal representing the sum of the three binary digits being designated as output signal S. The following table, Table II relates the values of the sum digit to the value of the three binary input digits in accordance with the ordinary rules of binary addition.

*Table II*

| Input Digits Represented by Signals | | | Sum Digit Represented by Signal S |
|---|---|---|---|
| $d_1$ | $d_3$ | $d_3$ | |
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

From Table II, it appears that in a binary addition of three digits, the sum digit will be a 1 if an odd number (one or three) of the input digits are 1-valued, and will be a 0 if an even number (zero or two) of the input digits are 1-valued. In terms of the levels of the corresponding input signals $d_1$, $d_2$ and $d_3$ and the output signal S, this relationship may be mathematically expressed in the form of the following logical equation, Eq. 4:

$$S=(d_1\oplus d_2)\oplus d_3 \qquad (4)$$

where the symbol $\oplus$ as hereinbefore explained indicates that the "exclusive or" operation is to be performed upon the signals conjoined thereby.

Eq. 4 thus indicates that sum signal S may be formed by combining signals $d_1$ and $d_2$ in accordance with the "exclusive or" operation to form a signal ($d_1$ $d_2$) which is 1-valued (high) only if $d_1$ exclusively or $d_2$ exclusively is 1-valued, and then combining the signals $(d_1\oplus d_2)$ and $d_3$ in accordance with the "exclusive or" operation to form an output signal which is 1-valued only if signal $(d_1\oplus d_2)$ exclusive is 1-valued or signal $d_3$ exclusively is 1-valued, this output signal being the signal S. It will be clear from a consideration of Eq. 4 that the output signal S formed by this operation will be 1-valued only if an odd number (one or three) of the input signals $d_1$, $d_2$ and $d_3$ are 1-valued, so that the output signal S formed by the multiple "exclusive or" operation defined by Eq. 4 will indeed represent the binary sum of the three input digits.

Figure 4:
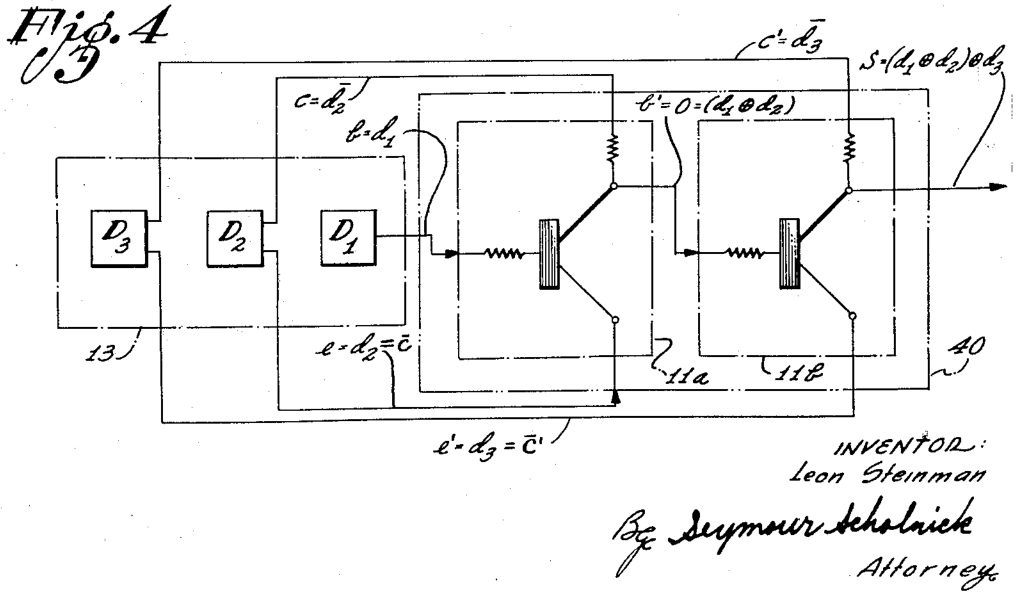
Fig. 4 is a circuit diagram illustrating two binary half-adders, connected together to form a binary full-adder, each half-adder being mechanized by a triple input single transistor gate in accordance with the invention.

Referring now to Fig. 4, there is shown a three digit binary adder which is mechanized in accordance with Eq. 4 and utilizes two triple input transistor gates 11*a* and 11*b* of the present invention to perform the two successive "exclusive or" operations as required by Eq. 4. As shown in Fig. 4, binary adder 40 receives from a source 13 a bilevel signal $d_1$ representing a first binary digit, a bilevel signal $d_2$ and a complementary signal $\bar{d}_2$ representing a second binary digit, and a bilevel signal $d_3$ and complementary signal $\bar{d}_3$ representing a third binary digit. Binary adder 40 functions to combine these signals in accordance with logical Eq. 4 to produce output signal S representing the sum of the three input digits.

As illustrated in Fig. 4, signals $d_1$, $d_2$ and $\bar{d}_2$ are applied as signals *b*, *e* and *c* respectively, to triple input transistor gate 11*a*, gate 11*a* combining these three input signals in accordance with its normal operation to perform an output signal $O=(d_1\oplus d_2)$. Since signals $e=d_2$ while $c=\bar{d}_2$ it is clear that signal *e* is the complement of signal *c* so that $e=d_2=\bar{c}$. The output signal $(d_1\oplus d_2)$ produced by gate 11*a* and the signals $d_3$ and $\bar{d}_3$ supplied by source 13 are applied as signals *b'*, *e'* and *c'*, respectively to the second triple input transistor gate 11*b*, which in turn functions to combine these signals to form the required output signal $S=(d_1\oplus d_2)\oplus d_3$, respectively representing the binary sum of the three input digits.

The relative simplicity and small number of components required for the mechanization of binary adder 40 is unparalleled in the art, and well illustrates the great advantages gained through utilization of the triple input transistor gate of the present invention.

What is claimed as new is:

1. A single transistor gate for combining first, second and third bilevel input signals to produce a bilevel output signal in accordance with a predetermined Boolean logical equation, said gate comprising: a single transistor having emitter, base and collector electrodes; means for receiving the first, second and third bilevel signals and for applying the first bilevel signal to said emitter electrode, the second bilevel signal to said base electrode and the third bilevel signal to said collector electrode to thereby produce the bilevel output signal at a predetermined one of said emitter and collector electrodes.

2. A single transistor gate for combining three bilevel signals *b*, *c* and *e* each having either a predetermined high voltage level or a predetermined low voltage level to produce a resultant bilevel output signal having a high voltage level only when signal *e* is high and signal *b* is at a predetermined one of its levels or when signal *c* is high and signal *b* is at the other of its levels, said gate comprising: a single transistor having emitter, base and collector electrodes, conductive means for applying the bilevel signal *e* to said emitter electrode; first impedance means for applying the bilevel signal *c* to said collector electrode; and second impedance means for applying the bilevel signal *b* to said base electrode; whereby the output signal is produced by said transistor at said collector electrode.

3. A single transistor gate for combining first, second and third bilevel input signals to produce a resultant bilevel output signal in accordance with a predetermined Boolean logical equation, said gate comprising: a single transistor having emitter, base, and collector electrodes; first impedance means for applying the first bilevel signal to a predetermined one of the pair of electrodes comprising said emitter and collector electrodes; conductive means for applying the second bilevel signal to the other of said pair of electrodes; second impedance means for applying the third bilevel signal to said base electrode; whereby the bilevel output signal is produced by said transistor at said predetermined one of said pair of electrodes.

4. A single transistor gate for combining three bilevel signals, a bilevel signal *b*, a bilevel signal *c*, and a bilevel signal $\bar{c}$ which is complementary to signal *c* to produce a bilevel output signal having a high level only when bilevel signal $c$ is high and bilevel signal $b$ is at a predetermined one of its levels or when bilevel signal $\bar{c}$ is high and bilevel signal $b$ is at the other of its levels, said gate comprising: a single transistor having emitter, base and collector electrodes; first means for applying bilevel signal $c$ to said collector electrode, second means for applying the complementary bilevel signal $\bar{c}$ to said emitter electrode; and third means for applying the bilevel signal $b$ to said base electrode; whereby the bilevel output signal is produced by said transistor at a predetermined one of said emitter or collector electrodes.

5. The gate defined by claim 4 wherein said transistor is a PNP transistor and the bilevel output signal has a high level only when bilevel signals $c$ and $b$ are both at the same levels, said first means comprising a first impedance element for applying the bilevel signal $c$ to said collector electrode, said third means comprising a second impedance element for coupling the bilevel signal $b$ to said base electrode; whereby the bilevel output signal is produced by said transistor at said collector electrode.

6. The gate defined by claim 4 wherein said transistor is an NPN transistor and the bilevel output signal has a high level only when bilevel signals $c$ and $b$ are at different levels, said first means comprising a first impedance element for applying the bilevel signal $c$ to said collector electrode, said third means comprising a second impedance element for applying the bilevel signal $b$ to said base electrode; whereby the bilevel output signal is produced by said transistor at said collector electrode.

7. A gating network comprising: means for producing a bilevel signal $b$, a bilevel signal $c$ and a bilevel signal $c$ complementary to signal $c$; and a single transistor gate for combining bilevel signals $b$, $c$ and $\bar{c}$ to produce a bilevel output signal O having a high level only when bilevel signal $c$ is high and bilevel signal $b$ is at a predetermined one of its levels or when bilevel signal $\bar{c}$ is high and bilevel signal $b$ is at the other of its levels, said gate including a single transistor having emitter, base and collector electrodes, first means for applying bilevel signal $c$ to said collector electrode, second means for applying the complementary bilevel signal $\bar{c}$ to said emitter electrode, and third means for applying the bilevel signal $b$ to said base electrode, whereby the bilevel output signal O is produced by said transistor at a predetermined one of said emitter or collector electrodes.

8. The gating network defined by claim 7 wherein said transistor is a PNP transistor and the bilevel output signal O has a high level only when bilevel signals $c$ and $b$ are both at the same level, said first means comprising a first impedance element for applying the bilevel signal $c$ to said collector electrode, said third means comprising a second impedance element for applying the bilevel signal $b$ to said base electrode; whereby the bilevel output signal O is produced by said transistor at said collector electrode.

9. The gating network defined by claim 7 wherein said transistor is an NPN transistor and the bilevel output signal O has a high level only when bilevel signals $c$ and $b$ are at different levels, said first means comprising a first impedance element for applying the bilevel signal $c$ to said collector electrode, said third means comprising a second impedance element for applying the bilevel signal $b$ to said base electrode; whereby the bilevel output signal O is produced by said transistor at said collector electrode.

10. The gating network defined by claim 7 which further includes signal generating apparatus for producing a bilevel signal $c'$ and a bilevel signal $\bar{c}'$ complementary to signal $c'$ and also an additional single transistor gate for combining bilevel signals O, $c'$ and $\bar{c}'$ to produce a bilevel output signal S having a high level only when signal $c'$ is high and bilevel signal O is at a predetermined one of its levels or when bilevel signal $\bar{c}'$ is high and bilevel signal O is at the other of its levels, said additional gate comprising an additional transistor having base, collector and emitter electrodes, and apparatus for applying bilevel signals O, $c'$ and $\bar{c}'$ to said base, emitter and collector electrodes, respectively of said additional transistor; whereby the bilevel output signal S is produced by said additional transistor at a predetermined one of said collector and emitter electrodes.

11. A summing network for combining a bilevel signal $d_1$ representing a first binary digit, a bilevel signal $d_2$ and a complementary bilevel signal $\bar{d}_2$ representing a second binary digit, and a bilevel signal $d_3$ and a complementary bilevel signal $\bar{d}_3$ representing a third digit to produce a bilevel output signal S representing the sum of the first, second and third binary digits, said summing network comprising: first and second transistors, each transistor having base, emitter and collector electrodes; first means for applying bilevel signal $d_1$ to the base electrode of said first transistor; second means for applying signal $d_2$ to the emitter electrode of said first transistor; third means for applying signal $\bar{d}_2$ to the collector electrode of said first transistor; coupling apparatus for electrically coupling the collector electrode of said first transistor to the base electrode of said second transistor; fourth means for applying bilevel signal $d_3$ to the emitter electrode of said second transistor and fifth means for applying bilevel signal $\bar{d}_3$ to the collector electrode of said second transistor; whereby the bilevel output signal S is produced by said gating network at the collector electrode of said second transistor.

12. A single transistor gate for combining first, second and third bilevel input signals in accordance with a predetermined Boolean function to produce a resultant bilevel output signal, the level of the output signal corresponding to the level of the second bilevel signal whenever the third bilevel signal has a predetermined polarity with respect to the first or second signal and corresponding to the level of the first signal whenever the third bilevel signal does not have the predetermined polarity with respect to the first or second signal, said gate comprising: a single transistor having emitter, base and collector electrodes; first impedance means for applying the first bilevel signal to a predetermined one of the pair of electrodes comprising said emitter and collector electrode; means for applying the second bilevel signal to the other of said pair of electrodes; second impedance means for applying the third bilevel signal to said base electrode to bias said transistor conductive or non-conductive in accordance with the polarity of the third signal with respect to the first and second signals; whereby the bilevel output signal is produced by said transistor at said predetermined electrode.

No references cited.